(12) United States Patent
Ho et al.

(10) Patent No.: US 9,349,806 B2
(45) Date of Patent: May 24, 2016

(54) SEMICONDUCTOR STRUCTURE WITH TEMPLATE FOR TRANSITION METAL DICHALCOGENIDES CHANNEL MATERIAL GROWTH

(71) Applicants: Taiwan Semiconductor Manufacturing Company Limited, Hsinchu (TW); National Chiao-Tung University, Hsinchu (TW)

(72) Inventors: Yen-Teng Ho, Tainan (TW); Yi Chang, Hsinchu County (TW)

(73) Assignee: Taiwan Semiconductor Manufacturing Company Limited and National Chiao-Tung University (TW)

( * ) Notice: Subject to any disclaimer, the term of this patent is extended or adjusted under 35 U.S.C. 154(b) by 0 days.

(21) Appl. No.: 14/326,575

(22) Filed: Jul. 9, 2014

(65) Prior Publication Data
US 2016/0013277 A1    Jan. 14, 2016

(51) Int. Cl.
| | | |
|---|---|---|
| H01L 29/06 | (2006.01) |
| H01L 29/24 | (2006.01) |
| H01L 29/04 | (2006.01) |
| H01L 29/78 | (2006.01) |
| H01L 29/66 | (2006.01) |
| H01L 21/02 | (2006.01) |
| H01L 21/383 | (2006.01) |

(52) U.S. Cl.
CPC ............ *H01L 29/24* (2013.01); *H01L 21/0242* (2013.01); *H01L 21/0262* (2013.01); *H01L 21/02378* (2013.01); *H01L 21/02381* (2013.01); *H01L 21/02389* (2013.01); *H01L 21/02433* (2013.01); *H01L 21/02447* (2013.01); *H01L 21/02458* (2013.01); *H01L 21/02568* (2013.01); *H01L 21/02631* (2013.01); *H01L 21/02661* (2013.01); *H01L 21/383* (2013.01); *H01L 29/04* (2013.01); *H01L 29/045* (2013.01); *H01L 29/66969* (2013.01); *H01L 29/7849* (2013.01)

(58) Field of Classification Search
CPC ... H01L 29/24; H01L 29/04; H01L 29/66969; H01L 29/7849; H01L 21/02378; H01L 21/02381; H01L 21/02389; H01L 21/0242; H01L 21/02433; H01L 21/02447; H01L 21/02458; H01L 21/02568; H01L 21/0262; H01L 21/02631; H01L 21/02661; H01L 21/383
See application file for complete search history.

(56) References Cited

U.S. PATENT DOCUMENTS

| 2005/0074576 A1* | 4/2005 | Chaiken ................ B82Y 10/00 428/64.1 |
| 2011/0108853 A1* | 5/2011 | Adachi ................... H01L 33/40 257/77 |

OTHER PUBLICATIONS

Loher et al.; "Epitaxial Growth of ZnSe on Si(111) with Lattice-Matched Layered InSe Buffer Layers" Jpn. J.Appl.Phys. Vo. 37, Sep. 15, 1998, (1998) pp. L 1062-L1064;pp. 1-4.*

*Primary Examiner* — Shaun Campbell
(74) *Attorney, Agent, or Firm* — Jones Day

(57) ABSTRACT

Disclosed is a semiconductor structure comprising a single crystal substrate, a channel layer formed above the substrate from a transition metal dichalcogenides (TMDC) material, and a single crystal epitaxial buffer layer formed between the substrate and the channel layer, wherein the buffer layer is formed from material having a lattice constant mismatch of less than 5% with the lattice constant of the channel layer material. Also, disclosed is a method of forming a semiconductor structure comprising selecting a substrate formed from a single crystal material, preparing the substrate for template growth, growing a template on the substrate wherein the template is formed from single crystal material, and growing channel material on the template wherein the channel material is formed from a TMDC material and wherein the buffer layer material has a lattice constant mismatch of less than 5% with the lattice constant of the channel layer material.

20 Claims, 5 Drawing Sheets

SEMICONDUCTOR STRUCTURE WITH TEMPLATE FOR TRANSITION METAL DICHALCOGENIDES CHANNEL MATERIAL GROWTH

BACKGROUND

The technology described in this patent document relates to transition metal dichalcogenides, and more specifically to forming semiconductor structures with transition metal dichalcogenides material as channel material.

Scaling of semiconductor devices, such as a MOSFET, has enabled continued improvement in speed, performance, density, and cost per unit function of integrated circuits over the past few decades. Two-dimensional transition metal dichalcogenides (TMDC) materials such as $MoS_2$ exhibit quantum confinement effect and are a promising channel material for FETs in low power consumption applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
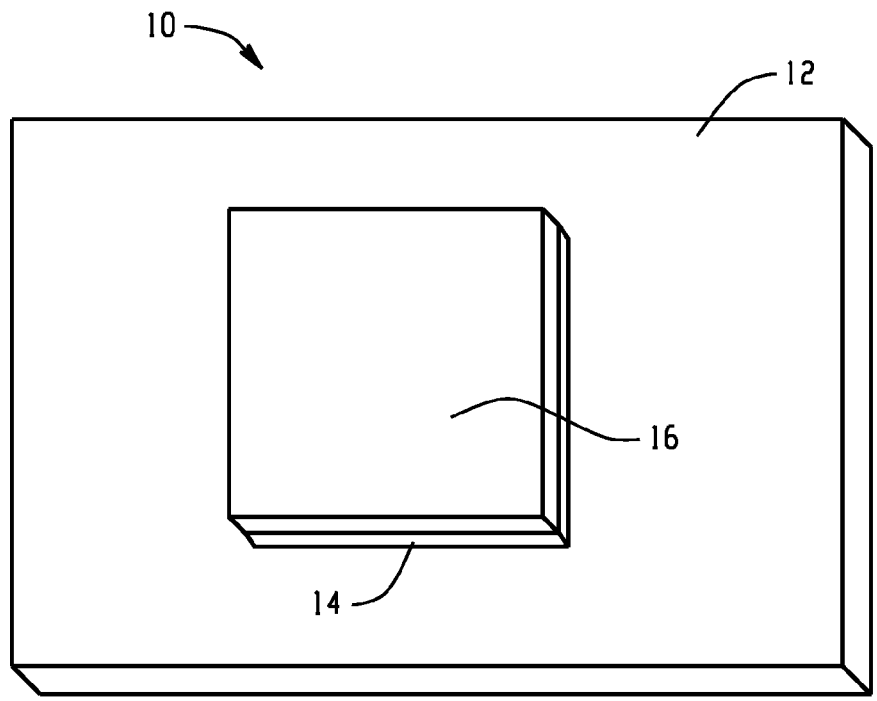
FIG. 1A depicts an example semiconductor structure with TMDC material as channel material.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Two-dimensional transition metal dichalcogenides (TMDC) materials such as $MoS_2$, exhibit desirable characteristics such as high channel mobility (~200 $cm^2$/Vs in some examples), a high current ON/OFF ratio (~$10^8$ in some examples), and a good sub-threshold swing (~70 mV per decade in some examples). It may be desirable to use TMDC materials as channel material in FETs. Developing a large-area growth method for TMDC materials can make it easier to fabricate FETs with TMDC material as channel material. Semiconductor structures and methods for fabricating semiconductor structures are disclosed which provide TMDC materials as channel material.

FIG. 1A depicts an example semiconductor structure 10 with TMDC material as channel material. The semiconductor structure 10 comprises a single crystal substrate 12. Examples of single crystal substrate materials that may be used include Si(111), 4H—SiC(0001), sapphire(0001) and AlN(0001). In this example, the single crystal substrate 12 comprises sapphire(0001).

The semiconductor structure 10 also includes a layer of channel layer material 16 from which the channel of a transistor may be formed. The channel layer 16 is formed above the substrate 12 from a transition metal dichalcogenides (TMDC) material. TMDCs are a class of materials with the chemical formula MX2, where M represents a transition metal element from group IV (e.g., Ti, Zr, Hf, etc.), group V (e.g., V, Nb or Ta) or group VI (e.g., Mo, W, etc.). The ternary compound of transition metal elements to form dichalcogenides is also included such as MoWS2, etc. The X represents a chalcogen (e.g., S, Se or Te). In this example, the channel material comprises $MoS_2$.

The semiconductor structure 10 further includes a buffer layer 14 formed between the substrate 12 and the channel layer 16. The buffer layer 14 is a single crystal epitaxial buffer layer formed between the substrate and the channel layer 16. The buffer layer 14 is formed from material having a lattice constant mismatch of less than 5% with the lattice constant of the channel layer material. The buffer layer may be formed from materials such as AlN(0001), GaN(0001), InGaN(001), InAlN(0001), BN(0001), TiN(111), and SiC(0001), which may reduce misfit dislocation density for the TMDC channel material. In this example, the buffer layer comprises AlN (0001).

Figure 1B:
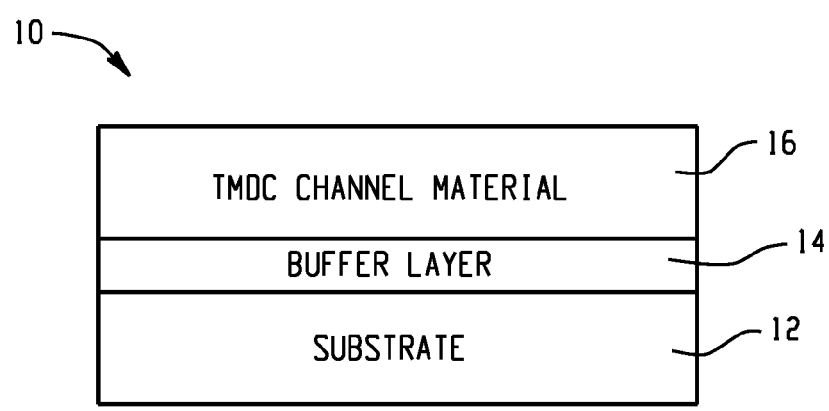
FIG. 1B depicts a cross-sectional view of the example semiconductor structure.

FIG. 1B depicts a cross-sectional view of the example semiconductor structure 10. In this example, the substrate 12 comprises sapphire(0001), the buffer layer 14 comprises AlN (0001), and the channel material 16 comprises MoS2.

Figure 2:
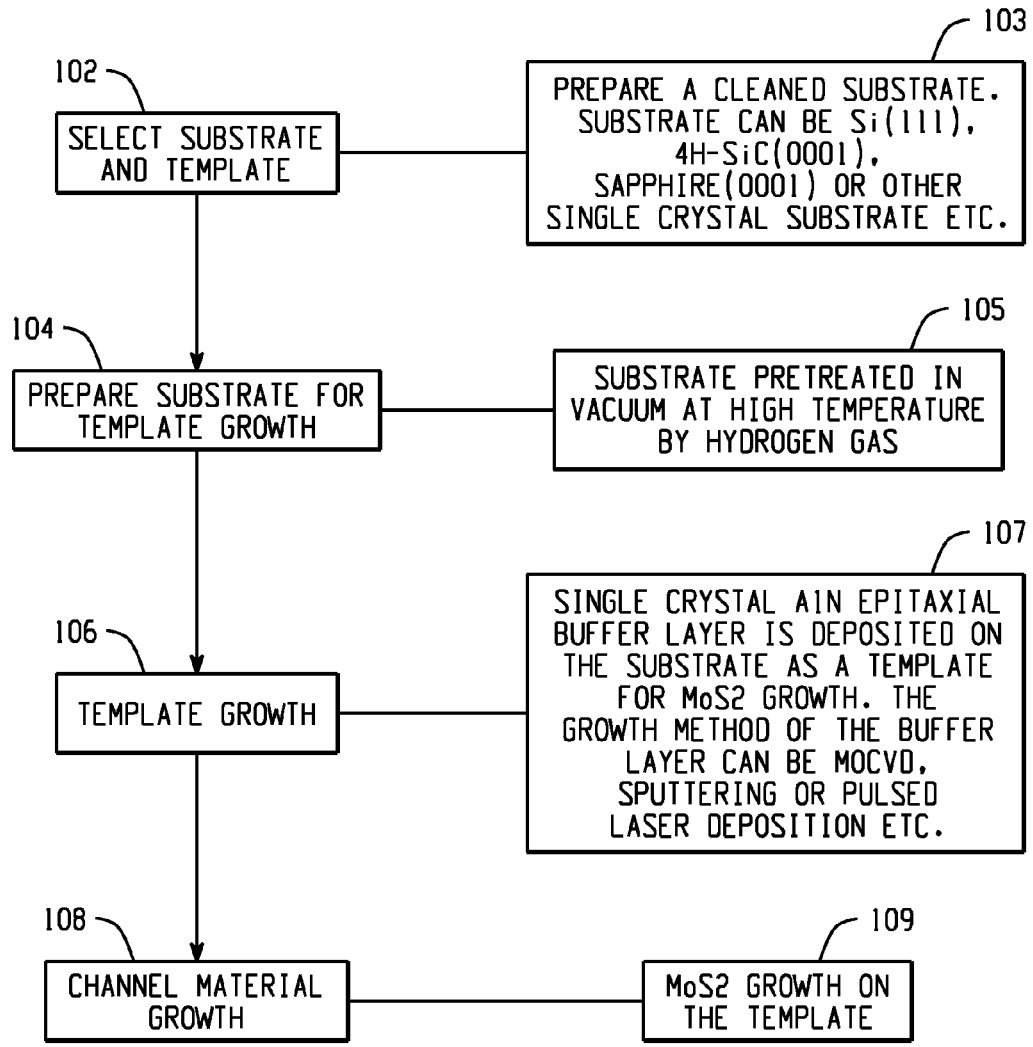
FIG. 2 depicts a process flow chart illustrating an example process for forming a semiconductor structure with TMDC material as channel material.

FIG. 2 is a process flow diagram illustrating an example process for forming a semiconductor structure with TMDC material as channel material. A substrate and template for channel material growth are selected (operation 102). The substrate is formed from a single crystal material, such as Si(111), 4H—SiC(0001), sapphire(0001) or other single crystal substrate (option 103). In this example, the substrate is also cleaned.

After substrate selection, the substrate is prepared for template growth (operation 104). Preparation may involve pre-treating the substrate with hydrogen gas in a vacuum environment at a high temperature (option 105).

After substrate preparation, a template is grown on the substrate as a buffer layer (operation 106). The buffer layer is formed from a single crystal material. In the example illustrated, a single crystal AlN epitaxial buffer layer is deposited on the substrate as a template for $MoS_2$ growth (option 107). The growth method of the buffer layer can be MOCVD, sputtering or pulsed laser deposition, among others.

After template growth, channel material is grown on the template (operation 108). In this example, the channel material comprises $MoS_2$ (option 109). A transistor or other semiconductor device can be fabricated using the semiconductor structure formed by the example process.

Figure 3:
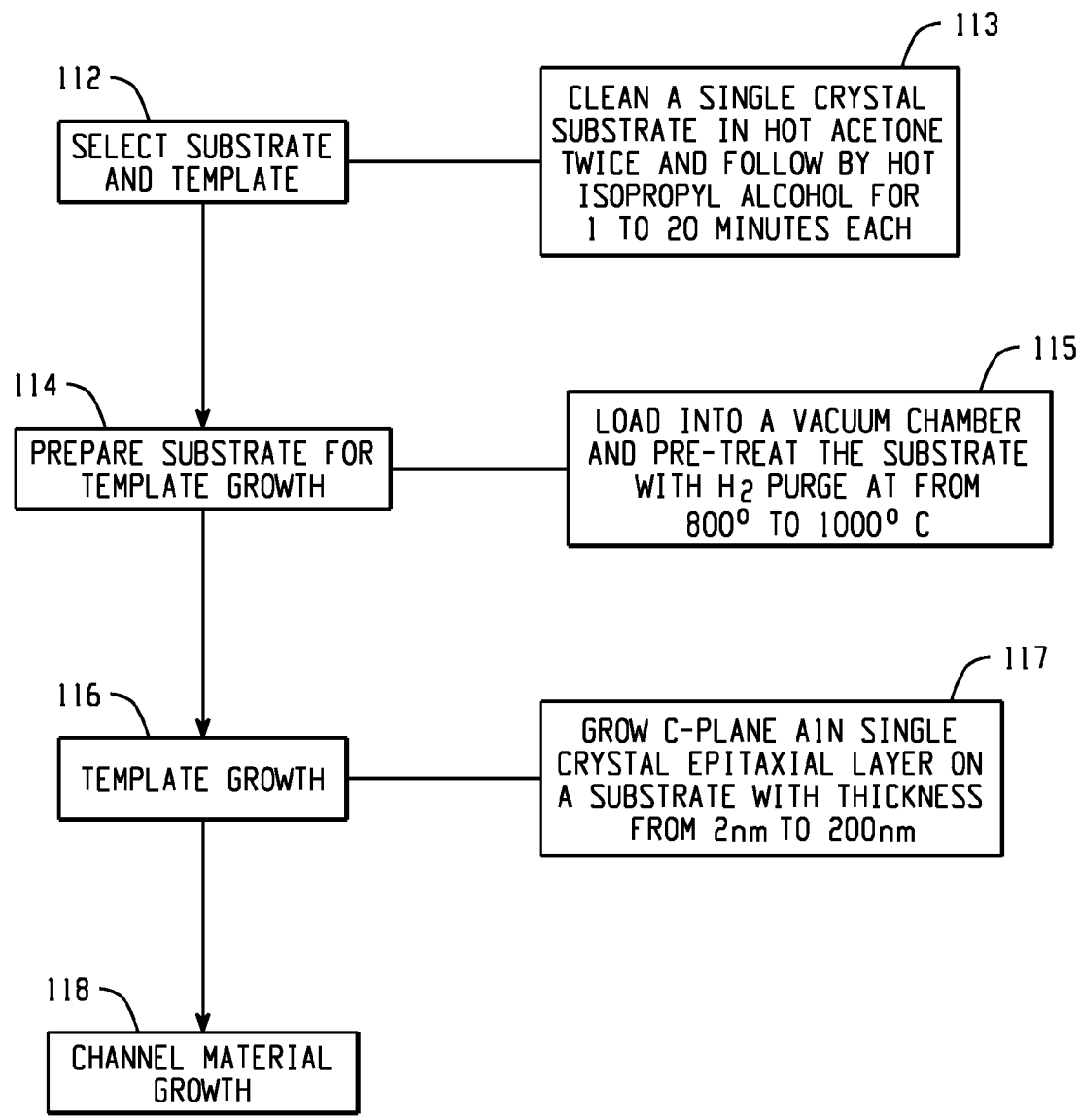
FIG. 3 depicts a process flow chart illustrating another example process for forming a semiconductor structure with TMDC material as channel material.

FIG. 3 is a process flow diagram illustrating another example process for forming a semiconductor structure with TMDC material as channel material. A substrate and template for channel material growth are selected (operation 112). In this example, the substrate is formed from a single crystal material and undergoes two cleanings in hot acetone and a cleaning using hot isopropyl alcohol (option 113).

After substrate selection, the substrate is prepared for template growth (operation 114). Preparation may involve pre-treating the substrate with a hydrogen gas ($H_2$) purge in a vacuum environment at a temperature of around 800-1000° C. (option 115).

After substrate preparation, a template is grown on the substrate as a buffer layer (operation 116). In the example illustrated, a c-plane AlN single crystal epitaxial layer is grown on the substrate with a thickness of about 2 nm to 200 nm (option 117).

After template growth, channel material is grown on the template (operation 118). A transistor or other semiconductor device can be fabricated using the semiconductor structure formed by the example process.

Figure 4:
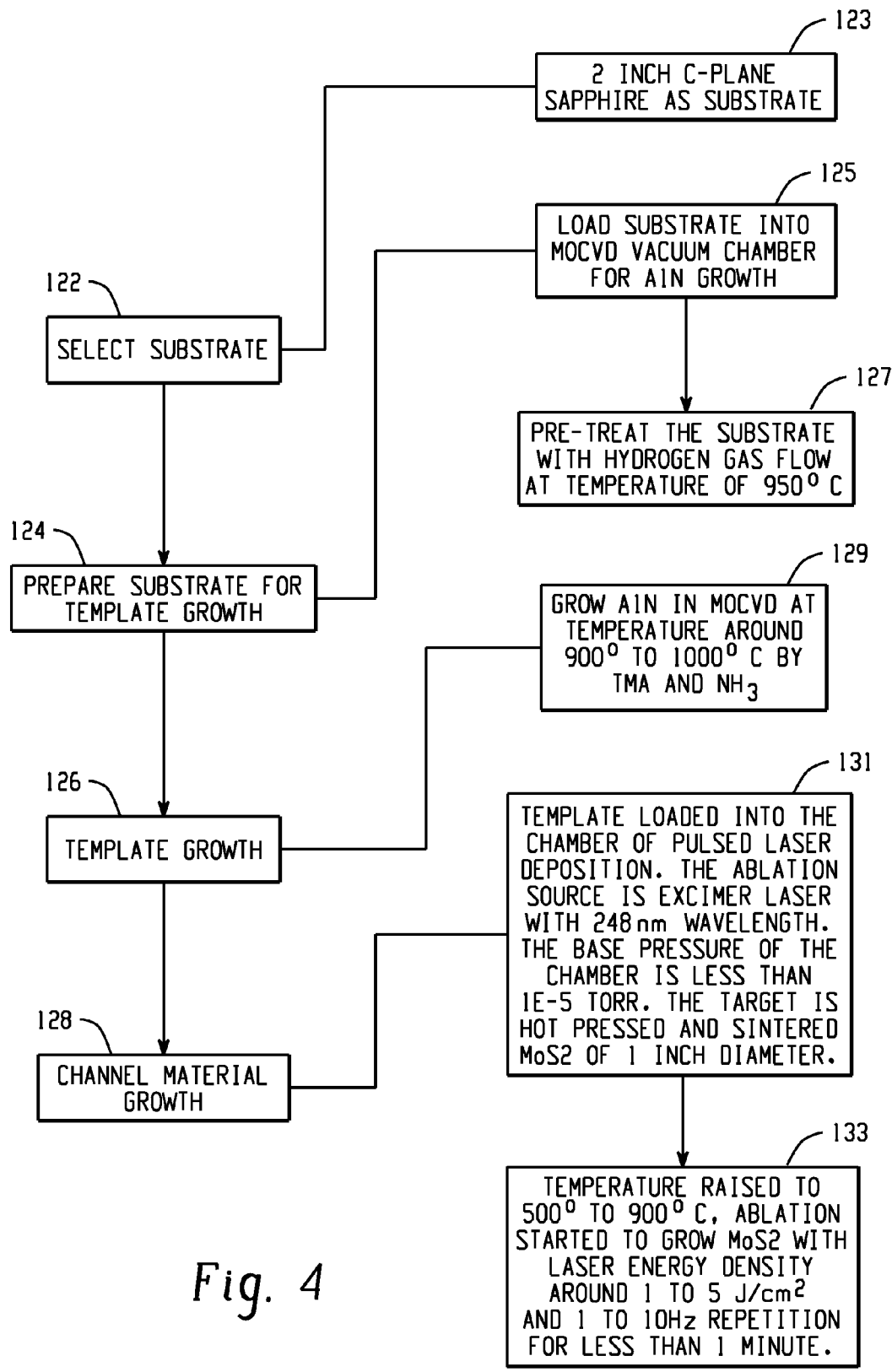
FIG. 4 depicts a process flow chart illustrating another example process for forming a semiconductor structure with TMDC material as channel material.

FIG. 4 is a process flow diagram illustrating another example process for forming a semiconductor structure with TMDC material as channel material. A substrate and template for channel material growth are selected (operation 122). The substrate, in this example, comprises 2" c-plane sapphire (option 123).

After substrate selection, the substrate is prepared for template growth (operation 124). Preparation may involve loading the substrate into a metal organic chemical vapor deposition (MOCVD) vacuum chamber for AlN growth (option 125) and pre-treating the substrate with a hydrogen gas ($H_2$) flow in the vacuum chamber at a temperature of around 950° C. (option 127).

After substrate preparation, a template is grown on the substrate as a buffer layer (operation 126). In the example illustrated, an AlN single crystal epitaxial layer is grown in the MOCVD vacuum chamber at a temperature of around 900-1000° C. by Al precursor Trimethylaluminum (referred to as TMA or $(CH3)_3Al$) and nitrogen precursor Ammonia (NH3) (option 129).

After template growth, the surface of AlN can be treated by a sulfurization process to form a sulfur termination on the template surface. The sulfurization process may comprise pretreatment using $H_2S$ gas or Sulfur vapor ambient at a temperature of around 500-1000° C.

After template growth, channel material is grown on the template (operation 128). In this example, channel material growth involves pulse laser deposition in a chamber wherein the ablation source is a 248 nm wavelength excimer laser, the chamber pressure is less than 1 E-5 torr, and the target is hot pressed and sintered $MoS_2$ of a 1 inch diameter (option 131). Ablation is performed at a temperature of approximately 500-900° C. and a laser energy density of approximately 1-5 $J/cm^2$ (option 133). A transistor or other semiconductor device can be fabricated using the semiconductor structure formed by the example process.

In any of the foregoing example processes, the channel material may be formed from a transition metal dichalcogenides (TMDC) material, wherein the buffer layer material has a lattice constant mismatch of less than 5% with the lattice constant of the channel layer material. In any of the foregoing example processes, the substrate may comprise a Si(111), 4H—SiC(0001), or sapphire(0001) single crystal substrate.

Figure 5:
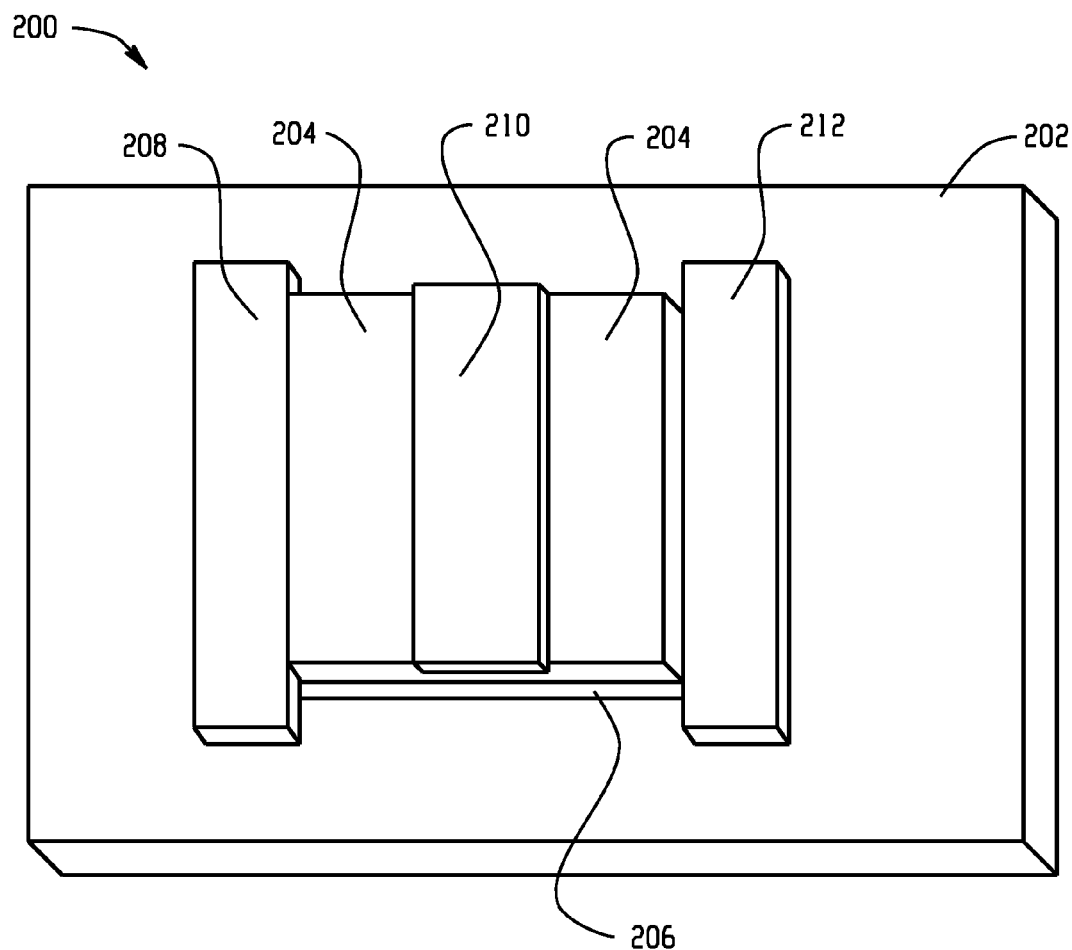
FIG. 5 depicts a top down view of an example semiconductor structure with TMDC material as channel material formed using one or more of the example processes.

FIG. 5 depicts a top down view of an example semiconductor structure 200 formed using one or more of the example processes. The example semiconductor structure 200 comprises a single crystal substrate 202. Examples of single crystal substrate materials include Si(111), 4H—SiC(0001), sapphire(0001) and AlN(0001).

The semiconductor structure 200 also includes a layer of channel layer material 204 from which the channel of a transistor may be formed. The channel layer 204 is formed above the substrate 202 from a transition metal dichalcogenides (TMDC) material. The chemical formula of the TMDC channel material comprises $MX_2$, wherein the M represents a transition metal element from group IV, group V, or group VI, and the X represents a chalcogen such as S, Se or Te.

The semiconductor structure 200 further includes a buffer layer 206 formed between the substrate 202 and the channel layer 204. The buffer layer 206 is a single crystal epitaxial buffer layer formed between the substrate and the channel layer 204. The buffer layer 206 is formed from material having a lattice constant mismatch of less than 5% with the lattice constant of the channel layer material. The buffer layer was grown on the substrate by metal organic chemical vapor deposition (MOCVD), sputtering or pulsed laser deposition. The buffer layer may comprise AlN(0001), GaN(0001), InGaN(001), InAlN(0001), BN(0001), TiN(111), or SiC (0001).

Also illustrated are transistor terminals for the semiconductor structure. Shown are a source region 208, a gate region 210, and a drain region 212. In the example illustrated, the substrate comprises sapphire(0001), the buffer layer comprises AlN(0001), and the channel material comprises $MoS_2$. Also, in the example illustrated, the substrate was pre-treated with hydrogen gas in a vacuum at high temperature prior to buffer layer formation.

The methods and structures disclosed herein can provide easier $MoS_2$ nucleation and epitaxy, a high crystalline quality of $MoS_2$ growth, and may be suitable for large area epitaxy.

In one embodiment, disclosed is a semiconductor structure comprising a single crystal substrate, a channel layer formed above the substrate from a transition metal dichalcogenides (TMDC) material, and a single crystal epitaxial buffer layer formed between the substrate and the channel layer. The buffer layer is formed from material having a lattice constant mismatch of less than 5% with the lattice constant of the channel layer material.

These aspects and other embodiments may include one or more of the following features. The chemical formula of the TMDC channel material may comprise MX2, wherein the M represents a transition metal element from group IV, group V, or group VI, and the X represents a chalcogen such as S, Se or Te. The channel material may comprise $MoS_2$. The buffer layer may comprise AlN(0001), GaN(0001), InGaN(001), InAlN(0001), BN(0001), TiN(111), or SiC(0001). The substrate may comprise Si(111), 4H—SiC(0001), sapphire (0001) or AlN(0001).

In another embodiment, disclosed is a method of forming a semiconductor structure comprising selecting a substrate wherein the substrate is formed from a single crystal material, preparing the substrate for template growth, growing a template as a buffer layer on the substrate wherein the buffer layer is formed from a single crystal material, and growing channel material on the template wherein the channel material is formed from a transition metal dichalcogenides (TMDC) material and wherein the buffer layer material has a lattice constant mismatch of less than 5% with the lattice constant of the channel layer material.

These aspects and other embodiments may include one or more of the following features. The preparing the substrate for template growth may comprise pre-treating the substrate with hydrogen gas in a vacuum at high temperature. The preparing the substrate for template growth may comprise loading the substrate into a vacuum chamber and pre-treating the substrate with a $H_2$ purge at 800-1000° C. The preparing the substrate for template growth may comprise loading the substrate into a metal organic chemical vapor deposition (MOCVD) vacuum chamber and pre-treating the substrate with a hydrogen gas flow at a temperature of approximately 950° C. The substrate may comprise a Si(111), 4H—SiC (0001), or sapphire(0001) single crystal substrate. The selecting a substrate may comprise cleaning a single crystal substrate with hot acetone and also with isopropyl alcohol. The selecting a substrate may comprise selecting a 2-inch c-plane sapphire as the substrate. The growing a template as a buffer layer may comprise growing the buffer layer by MOCVD, sputtering or pulsed laser deposition. The growing a template as a buffer layer may comprise growing the buffer layer by MOCVD at a temperature of around 900-1000° C. The growing a template as a buffer layer may comprise performing a sulfurization process to form a sulfur termination on a surface of the buffer layer. The performing a sulfurization process may comprise pretreatment using $H_2S$ gas or Sulfur vapor ambient. The performing a sulfurization process may comprise pretreatment at a temperature of around 500~1000° C.

In yet another embodiment, disclosed is a semiconductor structure comprising a single crystal substrate wherein the substrate comprises Si(111), 4H—SiC(0001), sapphire (0001) or AlN(0001), a channel layer formed above the substrate from a transition metal dichalcogenides (TMDC) material wherein the chemical formula of the TMDC channel material comprises MX2. The M represents a transition metal element from group IV, group V, or group VI, and the X represents a chalcogen. The semiconductor structure further comprises a single crystal epitaxial buffer layer formed between the substrate and the channel layer. The buffer layer is formed from material having a lattice constant mismatch of less than 5% with the lattice constant of the channel layer material. The buffer layer was grown on the substrate by metal organic chemical vapor deposition (MOCVD), sputtering or pulsed laser deposition.

These aspects and other embodiments may include one or more of the following features. The substrate may comprise sapphire(0001), the buffer layer may comprise AlN(0001), and the channel material may comprise $MoS_2$. The substrate may have been pre-treated with hydrogen gas in a vacuum at high temperature prior to buffer layer formation. The buffer layer may comprise GaN(0001), InGaN(001), InAlN(0001), BN(0001), TiN(111), or SiC(0001)) and may have been pre-treated with sulfurization before TMDCs materials growth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure comprising:
    selecting a substrate;
    preparing the substrate for template growth;
    growing a template as a buffer layer on the substrate, the buffer layer being formed from a SiC-based material; and
    growing on the template a transition metal dichalcogenides (TMDC) material, wherein the buffer layer has a lattice constant mismatch of less than 5% with the TMDC material.

2. The method of claim 1, wherein the preparing the substrate for template growth comprises pre-treating the substrate with hydrogen gas in a vacuum.

3. The method of claim 1, wherein the preparing the substrate for template growth comprises loading the substrate into a vacuum chamber and pre-treating the substrate with a $H_2$ purge at 800-1000° C.

4. The method of claim 1, wherein the preparing the substrate for template growth comprises loading the substrate into a metal organic chemical vapor deposition (MOCVD) vacuum chamber and pre-treating the substrate with a hydrogen gas flow at a temperature of 950° C.

5. The method of claim 1, wherein the growing a template as a buffer layer comprises growing the buffer layer by one of MOCVD, sputtering, and pulsed laser deposition.

6. The method of claim 1, wherein the growing a template as a buffer layer comprises growing the buffer layer by MOCVD at a temperature of 900-1000° C.

7. A method of forming a semiconductor structure comprising:
    selecting a substrate formed from a single crystal material;
    preparing the substrate for template growth;
    growing a template as a buffer layer formed from a single crystal material on the substrate, wherein the growing a template as a buffer layer comprises performing a sulfurization process to form a sulfur termination on a surface of the buffer layer; and
    growing a channel material formed from a transition metal dichalcogenides (TMDC) material on the template, wherein the buffer layer has a lattice constant mismatch of less than 5% with the channel material.

8. The method of claim 7, wherein the performing a sulfurization process comprises pretreatment using one of $H_2S$ gas and Sulfur vapor ambient.

9. The method of claim 7, wherein the performing a sulfurization process comprises pretreatment at a temperature of 500-1000° C.

10. A method of forming a structure, comprising:
    providing a substrate; and
    integrating a two-dimensional layered channel material onto the substrate by:
        epitaxially depositing a buffer layer formed from a nitride-based material on a surface of the substrate; and
        epitaxially depositing the two-dimensional layered material on the buffer layer, wherein a lattice constant mismatch between the buffer layer and the two-dimensional layered material is less than 5%.

11. The method of claim 10, wherein providing the substrate comprises providing a substrate comprising a single crystal material, wherein providing the substrate includes providing a substrate comprising one of Si(111), 4H—SiC (0001), sapphire(0001), and AlN(0001).

12. The method of claim 10, further comprises performing a substrate cleaning process before epitaxially depositing the buffer layer.

13. The method of claim 12, wherein the cleaning process includes cleaning the substrate in acetone twice followed by cleaning in isopropyl alcohol.

14. The method of claim 10, further comprises performing a substrate pre-treatment process before epitaxially depositing the buffer layer, wherein the pre-treatment process includes heating the substrate in a substantially vacuum environment at 800 to 1000° C.

15. The method of claim 10, wherein epitaxially depositing the buffer layer includes growing a buffer layer comprising a single crystal material.

16. A method of comprising:
providing a substrate; and
integrating a two-dimensional layered channel material onto the substrate by
epitaxially depositing a buffer layer on a surface of the substrate, wherein epitaxially depositing the buffer layer includes growing a single crystal material layer that comprises a c-plane AlN single crystal layer to a thickness from 2 nm to 200 nm, and
epitaxially depositing the two-dimensional layered channel material over the substrate on the buffer layer, wherein a lattice constant mismatch between the buffer layer and the two-dimensional layered channel material is less than 5%.

17. The method of claim 10, wherein epitaxially depositing the buffer layer includes performing epitaxial deposition using one of metal organic chemical vapor deposition (MOCVD), sputtering, and pulsed laser deposition.

18. The method of claim 10, wherein epitaxially depositing the two-dimensional layered material includes growing a transition metal dichalcogenides (TMDC) material on the buffer layer.

19. The method of claim 18, wherein growing the TMDC material includes performing pulse laser deposition of the TMDC material at a temperature of 500 to 900° C. with laser energy density of 1 to 5 $J/cm^2$.

20. A method of fabricating a high mobility 2D channel device, comprising:
providing a single crystal substrate having a source region and a drain region that are defined thereon; and
integrating a two-dimensional layered channel structure onto the substrate by:
epitaxially depositing a buffer layer on a surface of the substrate between the source and the drain regions; and
epitaxially depositing the two-dimensional layered channel structure comprising transition metal dichalcogenides material over the substrate on the buffer layer between the source and drain regions, wherein a lattice constant mismatch between the buffer layer and the two-dimensional layered channel structure is less than 5%.

* * * * *